(12) United States Patent
Lin et al.

(10) Patent No.: US 11,516,596 B2
(45) Date of Patent: Nov. 29, 2022

(54) MEMS DEVICE AND MANUFACTURING METHOD THEREOF

(71) Applicant: TAIWAN SEMICONDUCTOR MANUFACTURING COMPANY LTD., Hsinchu (TW)

(72) Inventors: Wei-Chu Lin, Hsinchu (TW); Yi-Chuan Teng, Hsinchu County (TW); Jung-Kuo Tu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 17/085,423

(22) Filed: Oct. 30, 2020

(65) Prior Publication Data

US 2022/0141596 A1 May 5, 2022

(51) Int. Cl.
*H04R 19/00* (2006.01)
*H04R 19/04* (2006.01)
*B81B 3/00* (2006.01)
*B81C 1/00* (2006.01)
*H04R 17/02* (2006.01)
*H04R 31/00* (2006.01)
*H04R 7/18* (2006.01)
*H04R 7/06* (2006.01)
*H04R 19/02* (2006.01)

(52) U.S. Cl.
CPC .......... *H04R 19/04* (2013.01); *B81B 3/0037* (2013.01); *B81C 1/00158* (2013.01); *H04R 7/06* (2013.01); *H04R 7/18* (2013.01); *H04R 17/02* (2013.01); *H04R 19/02* (2013.01); *H04R 31/003* (2013.01); *B81B 2201/0257* (2013.01); *B81B 2203/0127* (2013.01); *B81B 2203/0307* (2013.01); *B81B 2203/04* (2013.01); *H04R 2201/003* (2013.01)

(58) Field of Classification Search
CPC . H04R 19/04; H04R 7/06; H04R 7/18; H04R 17/02; H04R 19/02; H04R 31/003; H04R 2201/003; B81B 3/0037; B81B 2201/0257; B81B 2203/0127; B81B 2203/0307; B81B 2203/04; B81C 1/00158
See application file for complete search history.

(56) References Cited

U.S. PATENT DOCUMENTS

| | | | |
|---|---|---|---|
| 2004/0224091 A1* | 11/2004 | Rusu | B81C 1/00293 427/255.28 |
| 2019/0112182 A1* | 4/2019 | Metzger-Brueckl | B81C 1/00293 |
| 2021/0061651 A1* | 3/2021 | Gotoh | B81C 1/00158 |

\* cited by examiner

*Primary Examiner* — Matthew A Eason
(74) *Attorney, Agent, or Firm* — WPAT Law; Anthony King

(57) ABSTRACT

A MEMS device and a method for manufacturing a MEMS device are provided. The MEMS device includes an anchor, a diaphragm structure, and a sealing film. The diaphragm structure is disposed over the anchor and has an opening through the diaphragm structure. The sealing film covers at least a portion of the opening of the diaphragm structure.

20 Claims, 19 Drawing Sheets

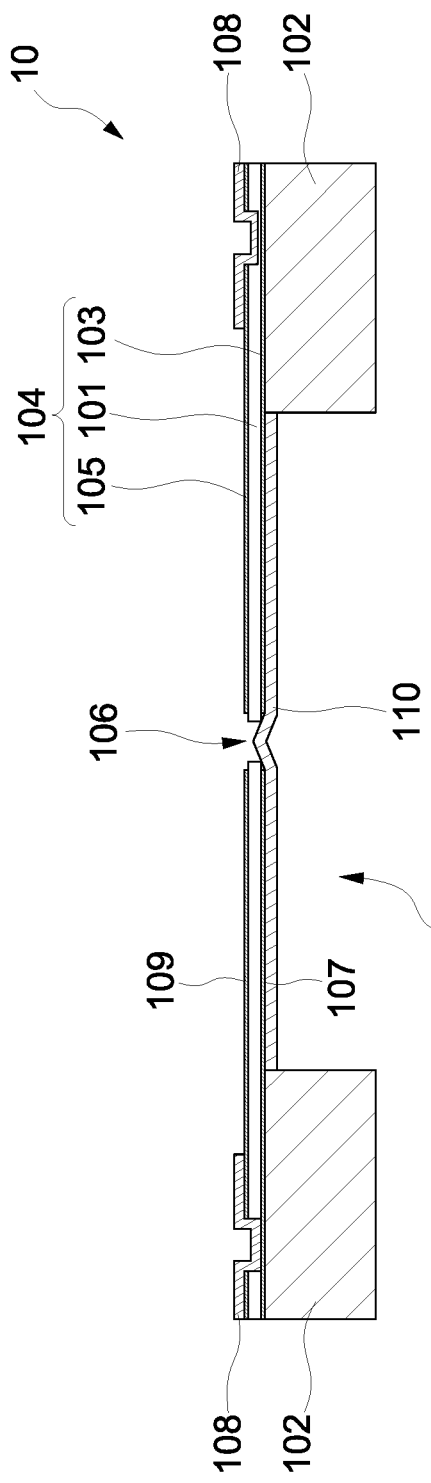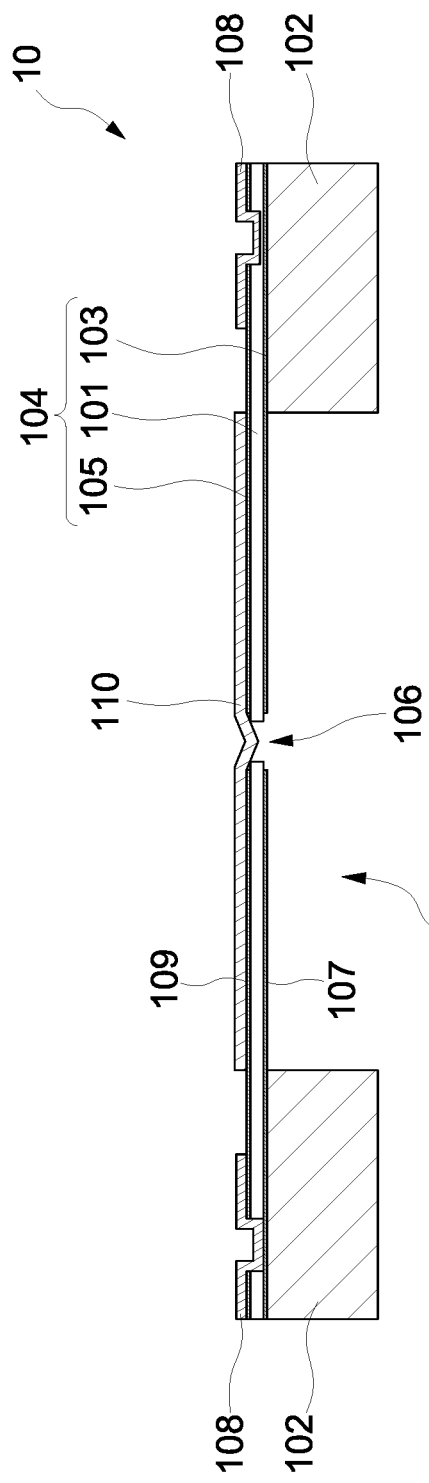

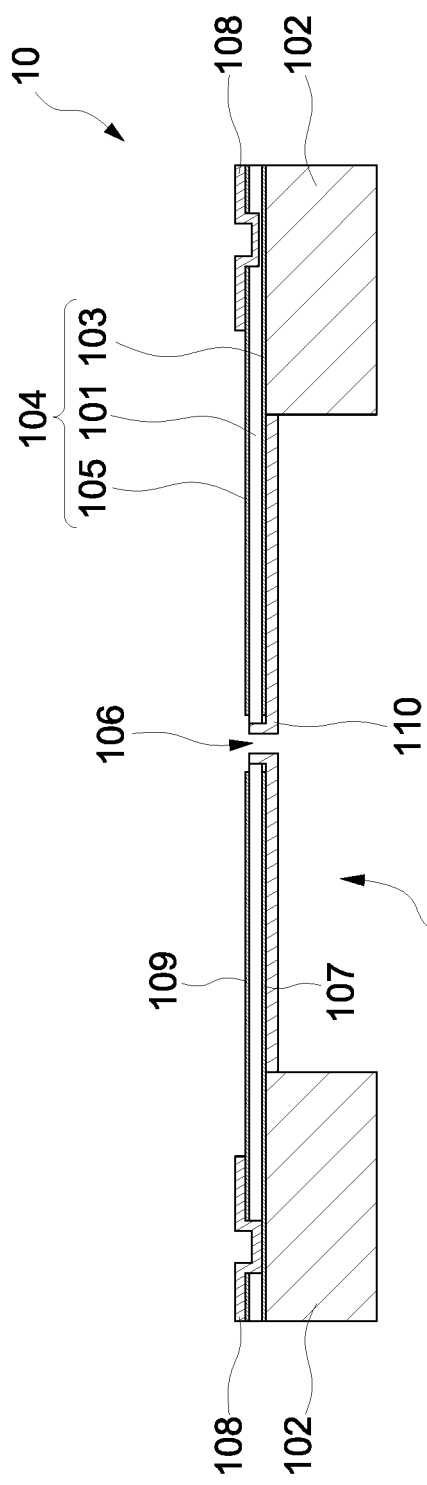
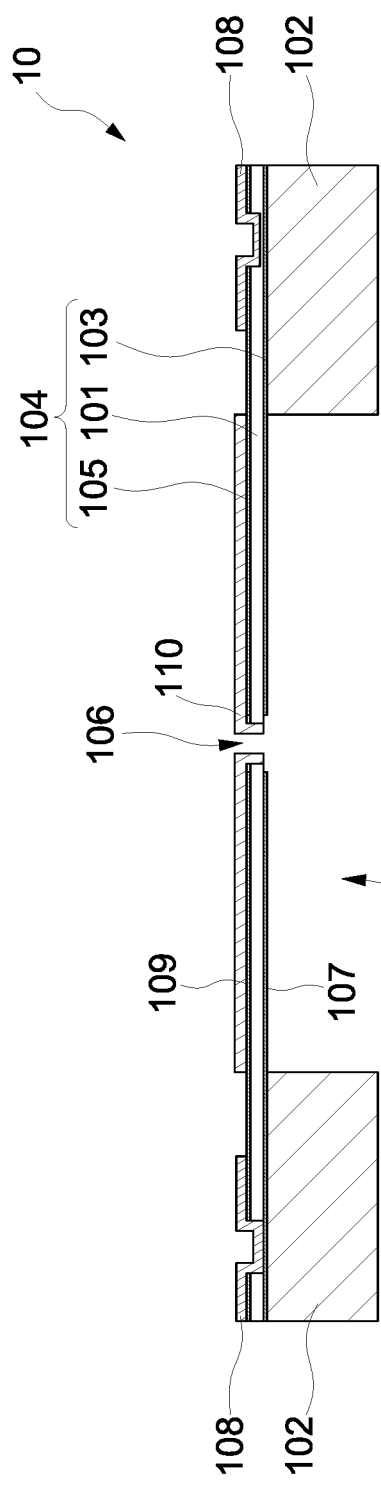

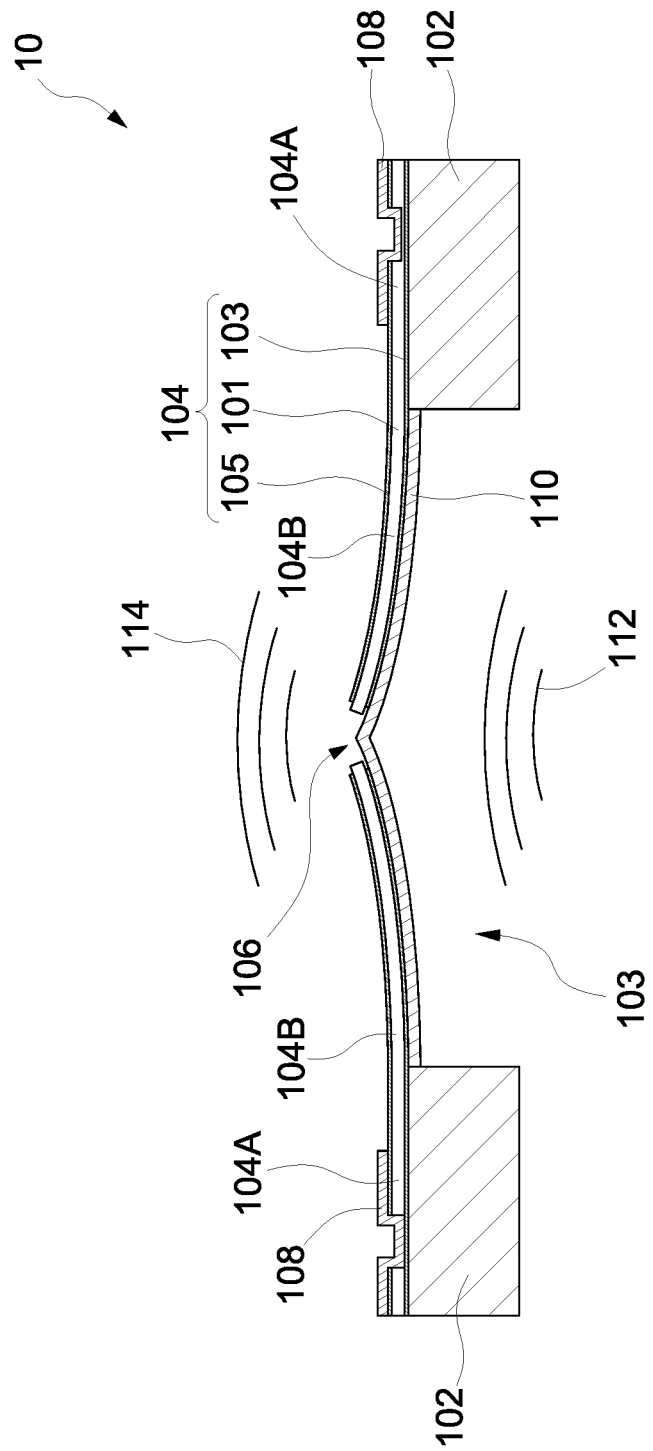

MEMS DEVICE AND MANUFACTURING METHOD THEREOF

BACKGROUND

With the advancement of electronic technology, microelectromechanical system (MEMS) devices such as speakers and microphones, are widely used in various electronic products including mobile phones, headphones, and wireless ear pods, due to the advantages such as shrunk dimension, reduced power consumption, and capability of being integrated into on-chip circuits.

Generally, MEMS speakers and microphones include a movable membrane or diaphragm which can make out-of-plane movement during operation. For MEMS speakers, the membrane or diaphragm is actuated to vibrate to generate sound waves, while for MEMS microphones, the membrane or diaphragm is actuated to vibrate by sound pressure. It is required for MEMS speakers to have higher sound pressure level (SPL) and for MEMS microphones to have higher sensitivity of sound. The vibration of the membrane or diaphragm influences the performance of the MEMS speakers and microphones. As the demand for MEMS devices is increased, MEMS devices and methods for manufacturing MEMS devices still need to be optimized in order to achieve better performance and more economic manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C and 1D are cross-sectional views of some embodiments of a MEMS device according to aspects of the present disclosure.

FIG. 2 is a cross-sectional view of some embodiments of a MEMS device during operation according to aspects of the present disclosure.

DETAILED DESCRIPTION

Figure 3:
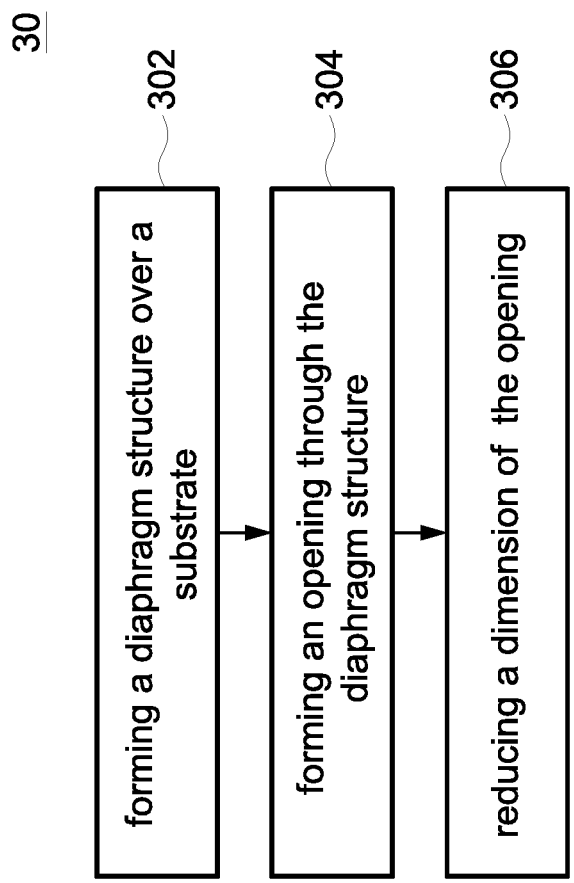
FIG. 3 is a flowchart representing a method for manufacturing a MEMS device according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range that can be contemplated by people having ordinary skill in the art. Alternatively, the terms "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

As used herein, the "substrate" refers to a base material on which various layers and structures are formed. In some embodiments, the substrate includes a semiconductor substrate, such as a bulk semiconductor substrate. By way of example, the bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulating substrate, such as a glass substrate, or any other suitable substrate.

As used herein, the term "fixed" refers to a structure directly or indirectly mounted on or in another structure.

As used herein, the term "suspended" refers to a structure spaced away from another structure, thereby allowing the structure is able to move in at least one direction with respective to another structure.

As used herein, the term "flexible" means that the element concerned can return to its original shape after deformation by a force and it does not negatively influence the movement or deformation, such as bending or vibration, of another element or structure which the element concerned is in contact with or is attached to.

In some embodiments, a MEMS device includes an anchor and a diaphragm (or a membrane) on the anchor. The diaphragm has an opening (or gap) through the diaphragm to reduce rigidity of the diaphragm and allow for larger displacement of the diaphragm. The larger displacement of the diaphragm increases sound pressure level (SPL) of a MEMS speaker or increases sound sensitivity of a MEMS microphone. However, during operation, when the diaphragm makes bending movement, the opening (or gap) is enlarged and air is likely to leak through the opening. As a result, the performance of the MEMS device (such as a speaker or a microphone) may be impaired. For example, the SPL of the MEMS speaker may be decreased or the sound sensitivity of the MEMS microphone may be lowered by the air leakage. The performance is worsened especially when the MEMS device is operated at lower frequency. Such air leakage issue becomes significant as the width of the opening (or gap) is increased to 2 μm or more. The air leakage issue can be mitigated by decreasing the dimension of the opening (or gap). However, this approach causes difficulty in manufacturing process, making the manufacturing process less controllable.

Some embodiments of a MEMS device and a manufacturing method thereof are therefore provided to alleviate the air leakage issue. In addition to an anchor and a diaphragm having an opening therethrough, the MEMS device includes a sealing film that fully or partially seals the opening of the diaphragm so that the opening is narrowed or completely closed. As a result, the air leakage issue is eliminated or at least mitigated, and the performance of the MEMS device can remain constant during operation. For example, the SPL of a MEMS speaker and the sound sensitivity of a MEMS microphone will not drop during operation. In some embodiments, due to the flexibility or elasticity of the sealing film, the diaphragm provided with the sealing film can still make bending movement and vibrate well. Therefore, the performance of the MEMS device can be improved. In addition, with the sealing film, the dimension of the opening can be increased, and thus the process control of etching the opening in the diaphragm becomes easier.

FIGS. 1A, 1B, 1C and 1D are cross-sectional views of some embodiments of a MEMS device according to aspects of the present disclosure. As depicted in FIGS. 1A, 1B, 1C and 1D, a MEMS device 10 includes an anchor 102 and a diaphragm structure (also referred to as a membrane) 104 over the anchor 102. The diaphragm structure 104 has an opening (also referred to as a gap) 106 through the diaphragm structure 104. The anchor 102 together with the diaphragm structure 104 defines a cavity 103. The opening 106 of the diaphragm structure 104 is located over the cavity 103. The MEMS device 10 further includes a sealing film 110 disposed on a surface of the diaphragm structure 104 and covering at least a portion of the opening 106. In some embodiments, the sealing film 110 angles towards a sidewall of the opening 106. In some embodiments, the sealing film 110 partially overlaps the diaphragm structure 104 and partially exposes the diaphragm structure 104. In some embodiments, the diaphragm structure 104 includes a lower electrode layer 103, an upper electrode layer 105, and a piezoelectric layer 101 sandwiched between the lower electrode layer 103 and the upper electrode layer 105. In some embodiments, the MEMS device 10 further includes a contact 108 electrically connected to the lower electrode layer 103 or to the upper electrode layer 105. In some embodiments, the diaphragm structure 104 has a thickness of approximately 5 μm to 10 μm, but not limited thereto. In some embodiments, when the thickness of the diaphragm structure 104 is less than 5 μm, the manufacturing may become challenging; and when the thickness is more than 10 μm, the diaphragm structure 104 may become too rigid to make bending movement or vibrate, in some embodiments, the sealing film 110 is electrically insulating. In some embodiments, the sealing film 110 includes a dielectric layer. In some embodiments, the sealing film 110 includes a flexible thin film. Examples of the flexible thin film include a polymer thin film such as a silicone (e.g., PDMS) thin film, or any other material having two-dimensional geometry. In some embodiments, the sealing film has a thickness of approximately 1 μm or less; when the thickness of the sealing film is more than 1 μm, the sealing film may become rigid and influence the movement of the diaphragm structure 104.

In some embodiments as illustrated in FIGS. 1A and 1B, the sealing film 110 forms a bridge across the opening 106 of the diaphragm structure 104. In some embodiments as illustrated in FIGS. 1A and 1B, the sealing film 110 extends across the opening 106 of the diaphragm structure 104. In some embodiments as illustrated in FIGS. 1A and 1B, the sealing film 110 fully seals the opening 106 of the diaphragm structure 104. In some embodiments as illustrated in FIGS. 1C and 1D, the sealing film 110 at least partially covers a sidewall of the opening 106. In some embodiments as illustrated in FIGS. 1C and 1D, the sealing film 110 partially seals the opening 106 to reduce a dimension of the opening 106. In some embodiments, the dimension of the opening 106 is reduced to approximately 2 micrometer or less. In some embodiments, the diaphragm structure 104 has a lower surface 107 adjacent to the anchor 102, and an upper surface 109 opposite to the lower surface 107, and the sealing film 110 is disposed on the lower surface 107 of the diaphragm structure 104 as shown in FIGS. 1A and 1C. In some embodiments, the sealing film 110 is disposed on the upper surface 109 of the diaphragm structure 104 as shown in FIGS. 1B and 1D.

FIG. 2 is a cross-sectional view of some embodiments of a MEMS device during operation according to aspects of the present disclosure. In some embodiments, the diaphragm structure 104 has a stationary end 104A which is fixed on the anchor 102 and a movable end 104B opposite to the stationary end 104A. The movable end 104B defines the opening 106 through the diaphragm structure 104. In some embodiments, the MEMS device 10 (such as a microphone) receives a sound wave input 112 which causes the movable end 104B of the diaphragm structure 104 to make out-of-plane movement (e.g., bend upwards and downwards repeatedly (i.e., vibrate)). In some embodiments, the MEMS device 10 (such as a speaker) produces a sound wave output 114 by bending the movable end 10413 of the diaphragm structure 104 upwards and downwards repeatedly. During the out-of-plane movement, the opening 106 is enlarged and air might leak through the opening 106 without the sealing film 110. The sealing film 110 partially or fully seals the opening 106 and reduces a dimension of the opening 106 (when the sealing film fully seals the opening 106, the dimension of the opening 106 is reduced to zero), thereby preventing or mitigating the air leakage issue. In some embodiments, the sealing film 110 is thin and flexible enough to not influence the bending movement of the diaphragm structure 104. With the sealing film 110 reducing the dimension of the opening 106, the opening 106 can be formed with a larger dimension during an etching operation, and therefore advantageously the etching operation for forming the opening 106 becomes easier and more controllable. In other words, the introduction of the sealing film 110 makes it possible to go beyond current process limit.

FIG. 3 is a flowchart representing a method for manufacturing a MEMS device according to aspects of the present disclosure. The method for manufacturing a MEMS device 30 includes an operation 302 in which a diaphragm structure (or a membrane) is formed over a substrate. The method 30 further includes an operation 304 in which an opening is formed through the diaphragm structure. The method 30 further includes an operation 306 in which a dimension of the opening is reduced. In some embodiments, the operation 306 includes forming a sealing film to cover at least a portion of the opening. In some embodiments, the method 30 further includes forming a temporary adhesive layer and a carrier over the diaphragm structure after forming the opening through the diaphragm structure. In some embodiments, the method 30 further includes forming a cavity in the substrate. In some embodiments, the method 30 further includes removing the temporary adhesive layer and the carrier after forming the cavity in the substrate.

Although the method 30 and other methods illustrated and/or described hereinafter are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 4:
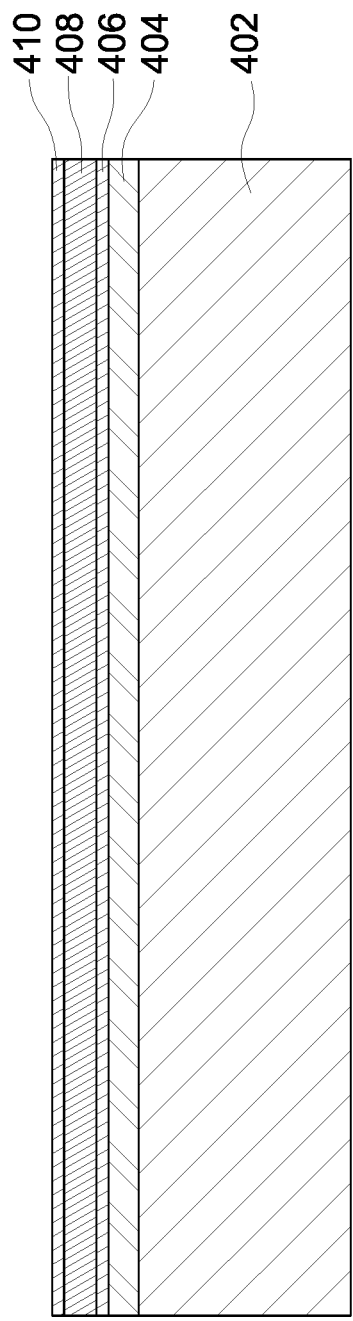
FIGS. 4 to 9 are cross-sectional views of some embodiments of a MEMS device at various fabrication stages according to aspects of the present disclosure.

FIGS. 4 to 9 are cross-sectional views of some embodiments of a MEMS device at various fabrication stages according to aspects of the present disclosure. As shown in FIG. 4, a substrate 402 is provided. A dielectric layer 404, a lower electrode layer 406, a piezoelectric layer 408, and an upper electrode layer 410 are formed on the substrate 402, for example, by deposition. The piezoelectric layer 408 is sandwiched between the lower electrode layer 406 and the upper electrode layer 410. The dielectric layer 404 electrically isolates the lower electrode layer 406 from substrate 402. In some embodiments, the substrate 402 is a semiconductor substrate such as a silicon substrate, but not limited thereto. In some embodiments, the lower electrode layer 406, a piezoelectric layer 108, and an upper electrode layer 410 are together called an electrode stack and isolated from the substrate 402 by the dielectric layer 404. In some embodiments, the dielectric layer 404 includes silicon oxide, or any other suitable material, or a combination thereof. In some embodiments, the lower electrode layer 406 and upper electrode layer 410, independently of each other, the same or differently, include a conductive material such as metal (e.g., copper, silver and gold), alloy, or a combination thereof. In some embodiments, the piezoelectric layer 408 includes a piezoelectric material such as AlN, ZnO, $Pb(Zr_{1-x},Ti_x)O_3$ (PZT), any other suitable material, or a combination thereof. Other suitable materials for the aforementioned layers are within the contemplated scope of the present disclosure.

Figure 5:
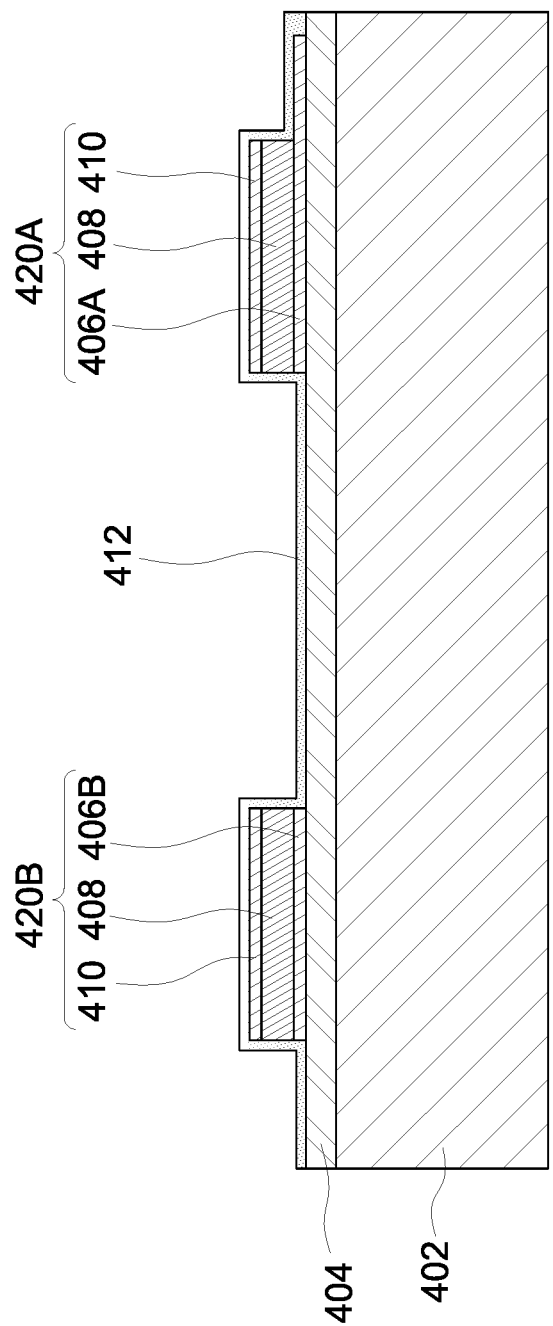

As shown in FIG. 5, the lower electrode layer 406, the piezoelectric layer 408, and the upper electrode layer 410 are patterned, for example, by lithography to expose a portion of the dielectric layer 404, In some embodiments, the lower electrode layer 406 is patterned to form a first lower electrode layer 406A having a portion exposed from the piezoelectric layer 408 and the upper electrode layer 410. In some embodiments, the lower electrode layer 406 is patterned to form a second lower electrode layer 406B which is completely covered by the piezoelectric layer 408. The first lower electrode layer 406A, the piezoelectric layer 408, and the upper electrode layer 410 together form a first electrode stack 420A. The second lower electrode layer 406B, the piezoelectric layer 408, and the upper electrode layer 410 together form a second electrode stack 420B. A passivation layer 412 is then formed on the dielectric layer 404, the first electrode stack 420A and the second electrode stack 420B, for example, by deposition. In some embodiments, the passivation layer 412 is disposed along an upper surface of the dielectric layer 404, the first electrode stack 420A, and the second electrode stack 42013, and along a sidewall of the first electrode stack 420A and the second electrode stack 420B. In some embodiments, the passivation layer 412 isolates the first electrode stack 420A and the second electrode stack 42013 from ambient atmosphere. In some embodiments, the passivation layer 412 includes polyimide, borophosphosilicate glass (BPSG), silicon nitride (SiN), polybenzoxazole (PBO), any other suitable material, or a combination thereof.

Figure 6:
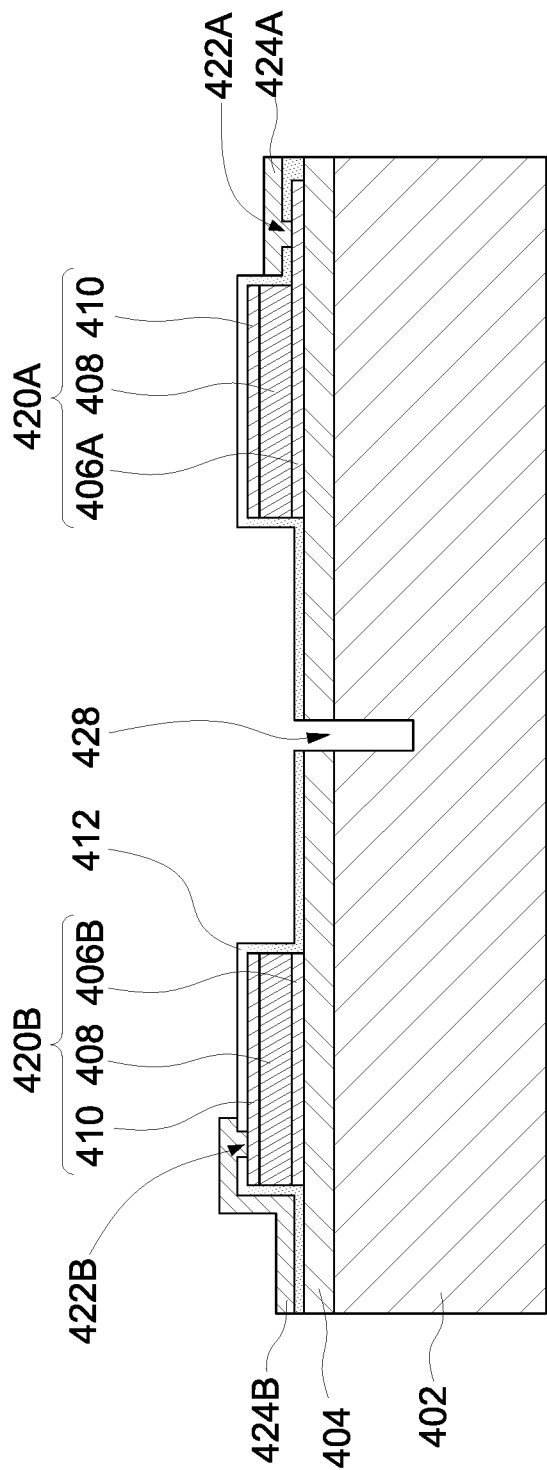

As shown in FIG. 6, a first via 422A and a second via 422B are formed through the passivation layer 412, for example, by etching. The first via 422A exposes a portion of the first lower electrode layer 406A of the first electrode stack 420A. The second via 422B exposes a portion of the upper electrode layer 410 of the second electrode stack 420B. A metal layer is deposited and patterned to form a first contact layer 424A and a second contact layer 424B as shown in FIG. 6. The first contact layer 424A fills the first via 422A and connects to the first lower electrode layer 406A of the first electrode stack 420 A. The second contact layer 424B fills the second via 422B and connects to the upper electrode layer 410 of the second electrode stack 420B. An opening (or a gap or a trench) 428 is formed through the passivation layer 412, the dielectric layer 404, and a portion of the substrate 402, for example, by etching, in some embodiments, the opening 428 is formed between the first electrode stack 420A and the second electrode stack 420B. In some embodiments, the opening 428 has a dimension of around a few micrometers, or any other suitable dimension. In some embodiments, the opening 428 has a dimension of more than 2 μm, and therefore an etching operation to form the opening 428 is easier and more controllable.

Figure 7:
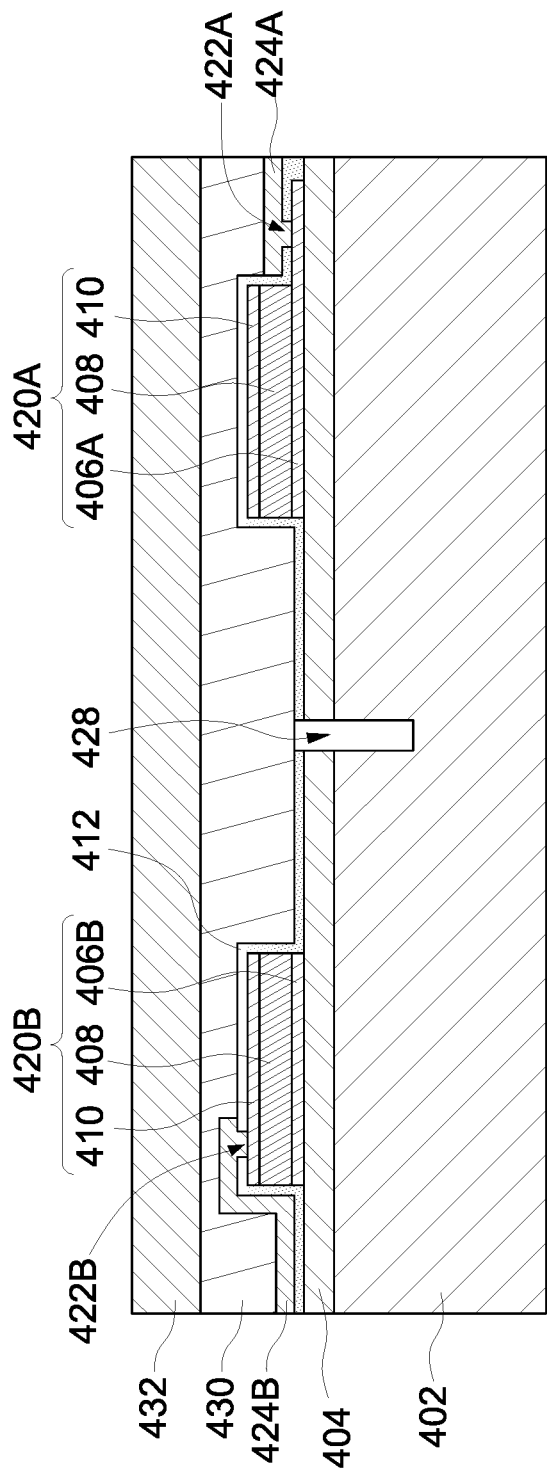

As shown in FIG. 7, a temporary adhesive layer 430 is formed over an upper surface of the passivation layer 412 opposite to the substrate 402. In some embodiments, the temporary adhesive layer 430 covers the first contact layer 424A, the second contact layer 424B, and the passivation layer 412. A carrier 432 is provided on the temporary adhesive layer 430. The substrate 402 is therefore temporarily bonded to the carrier 432 through the temporary adhesive layer 430. In some embodiments, the temporary adhesive layer includes an adhesive material such as wax, hydrocarbon oligomer or polymer, acrylate, epoxy, silicone, or any other suitable material, or a combination thereof. In some embodiments, the carrier 432 is a glass carrier, but not limited thereto.

Figure 8:
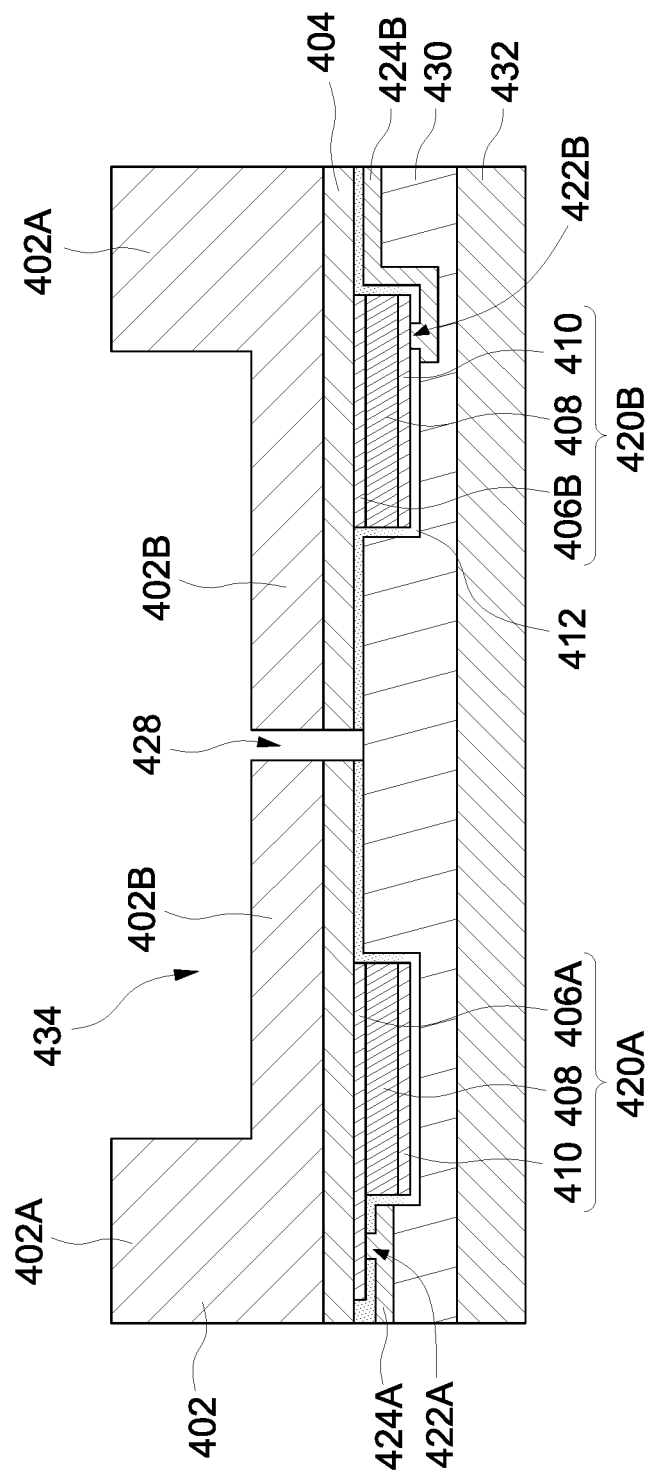

As shown in FIG. 8, the substrate 402 with the aforementioned layers is flipped over (turned upside down) such that the substrate 402 faces upwards and the carrier 432 faces downwards. A cavity 434 is formed in the substrate 402, for example, by etching, resulting in forming an anchoring portion 402A and a vibrating portion 402B of the substrate 402. The cavity 434 is in fluid communication with the opening 428. In some alternative embodiments, the cavity 434 is etched to a depth corresponding to a whole thickness of the substrate 402 to form an anchoring portion 402A of the substrate 402, while the vibrating portion 402B may be omitted.

Figure 9:
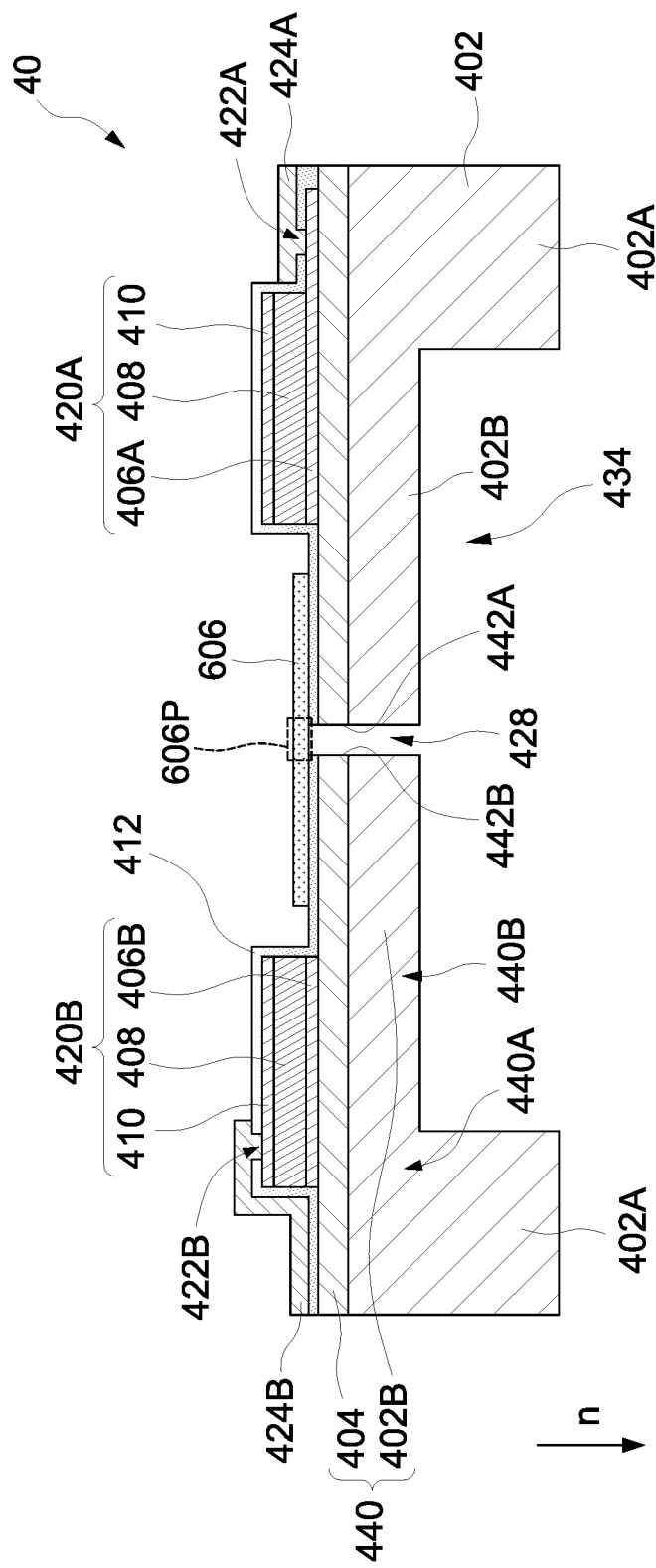

Referring to FIG. 9, the substrate 402 is flipped over again such that the cavity 434 and the substrate 402 faces downwards and the carrier 432 faces upwards. Subsequently, the carrier 432 and the temporary adhesive layer 430 are removed from the substrate 402. A sealing film 606 is then formed on the passivation layer 412, for example, by deposition to seal the opening 428, and thereby a MEMS device 40 is formed. The MEMS device 40 includes the sealing film 606 on an upper surface of the passivation layer 412 opposite to the substrate 402, wherein the sealing film 606 fully seals the opening 428.

As shown in FIG. 9, the resulting MEMS device 40 includes a substrate 402 having an anchoring portion 402A and a vibrating portion 402B. The MEMS device 40 also includes a dielectric layer 404 on the substrate 402. In some embodiments, the MEMS device 40 includes a membrane 440 including the vibrating portion 402B of the substrate 402 and the dielectric layer 404. The membrane 440 has a stationary end 440A and a movable end 440B opposite to the stationary end 440A, wherein the stationary end 440A is fixed to the anchoring portion 402A of the substrate 402. The movable end 440B defines an opening 428 through the membrane 440, wherein the opening 428 has a first sidewall 442A and a second sidewall 442B opposite to the first sidewall 442A. The MEMS device 40 further includes a sealing film 606 over a surface of the membrane 440, wherein a projection of a portion 606P of the sealing film 606 in a direction n normal to the surface of the membrane 440 is between the first sidewall 442A and the second sidewall 442B of the opening 428. In some embodiments, the sealing film 606 fully seals the opening 428 as shown in FIG. 9, In some embodiments, the sealing film 606 partially covers the membrane 440 and partially exposes the membrane 440. The MEMS device 40 further comprises a first electrode stack 420A and a second electrode stack 420B over the membrane 440, wherein the sealing film 606 is disposed between the first electrode stack 420A and the second electrode stack 420B.

The present disclosure is not limited to the above-mentioned embodiments, and may include other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 10:
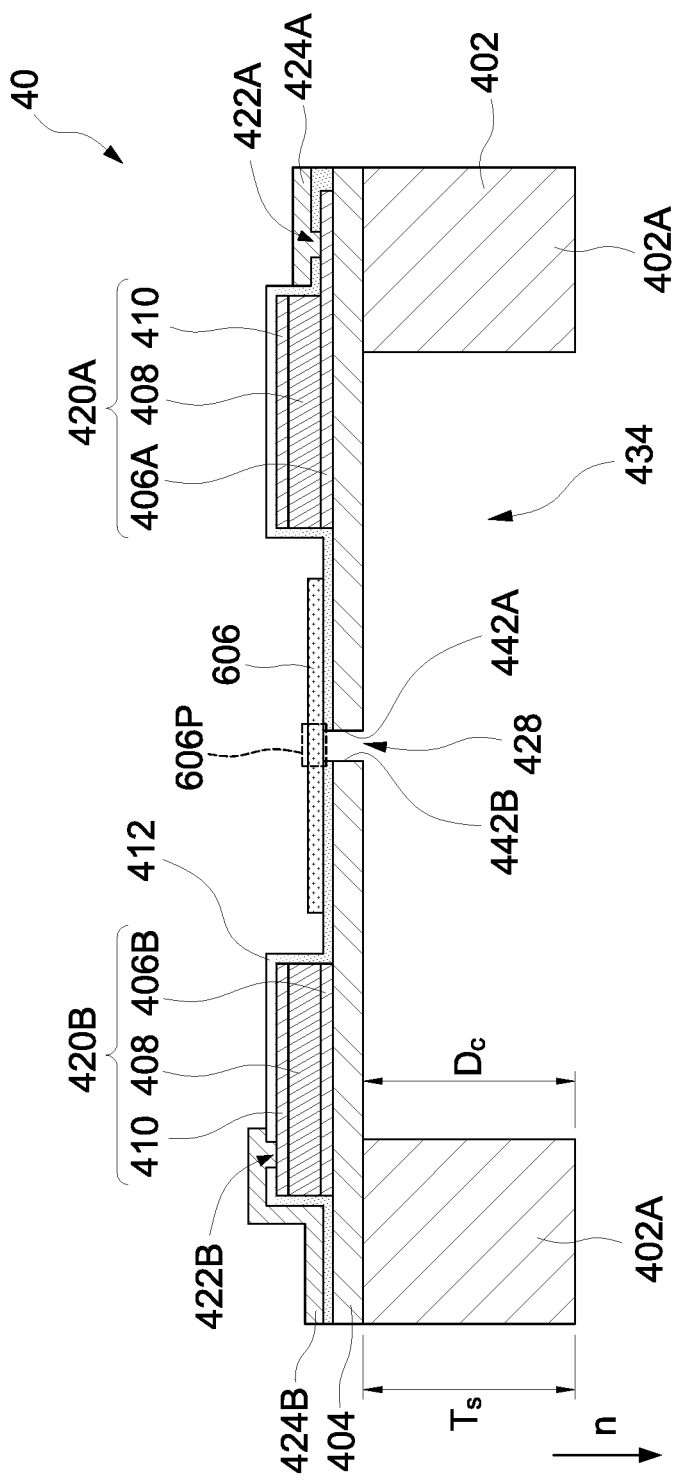
FIGS. 10 and 11 are cross-sectional views of some embodiments of a MEMS device alternative to FIG. 9 according to aspects of the present disclosure.
Figure 11:
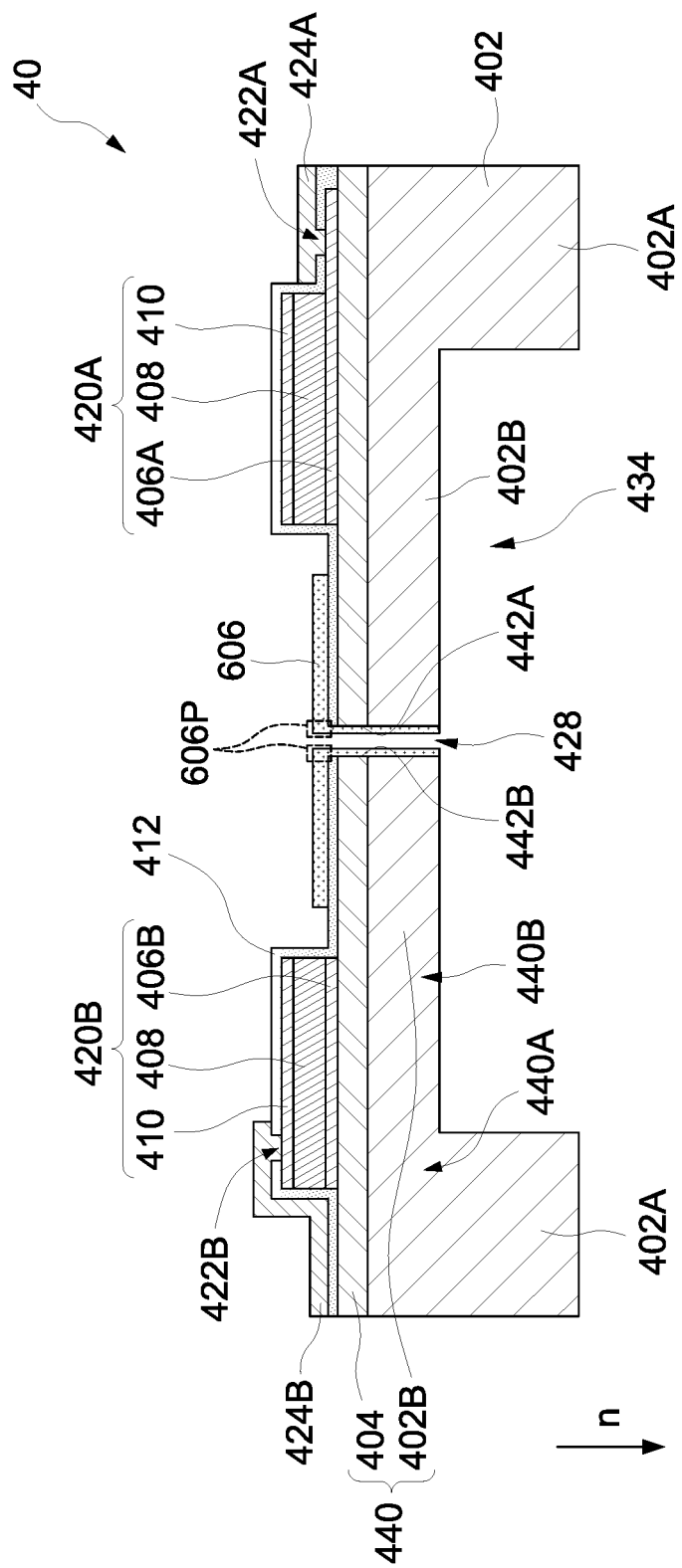

FIGS. 10 and 11 are cross-sectional views of some embodiments of a MEMS device alternative to FIG. 9, according to aspects of the present disclosure. In some embodiments as shown in FIG. 10, the cavity 434 has a depth $D_c$ identical to a thickness $T_s$ of the substrate 402. The cavity 434 is formed by etching the substrate 402 to a depth corresponding to the thickness $T_s$ of the substrate 402 in an operation shown in FIG. 8, thereby resulting in forming an anchoring portion 402A of the substrate 402, while the vibrating portion may be omitted. In some embodiments as shown in FIG. 10, the membrane 440 of the MEMS device 40 includes the dielectric layer 404, and the vibrating portion of the substrate 402 is omitted.

In some embodiments as shown in FIG. 11, the sealing film 606 is formed not only over the membrane 440, but also conformally along at least a portion of the first sidewall 442A and/or the second sidewall 442B of the opening 428, for example, by sputtering, CVD, ALD, or any other suitable method. In some embodiments as shown in FIG. 11, the sealing film 606 partially seals the opening 428 of the membrane 440.

Figure 12:
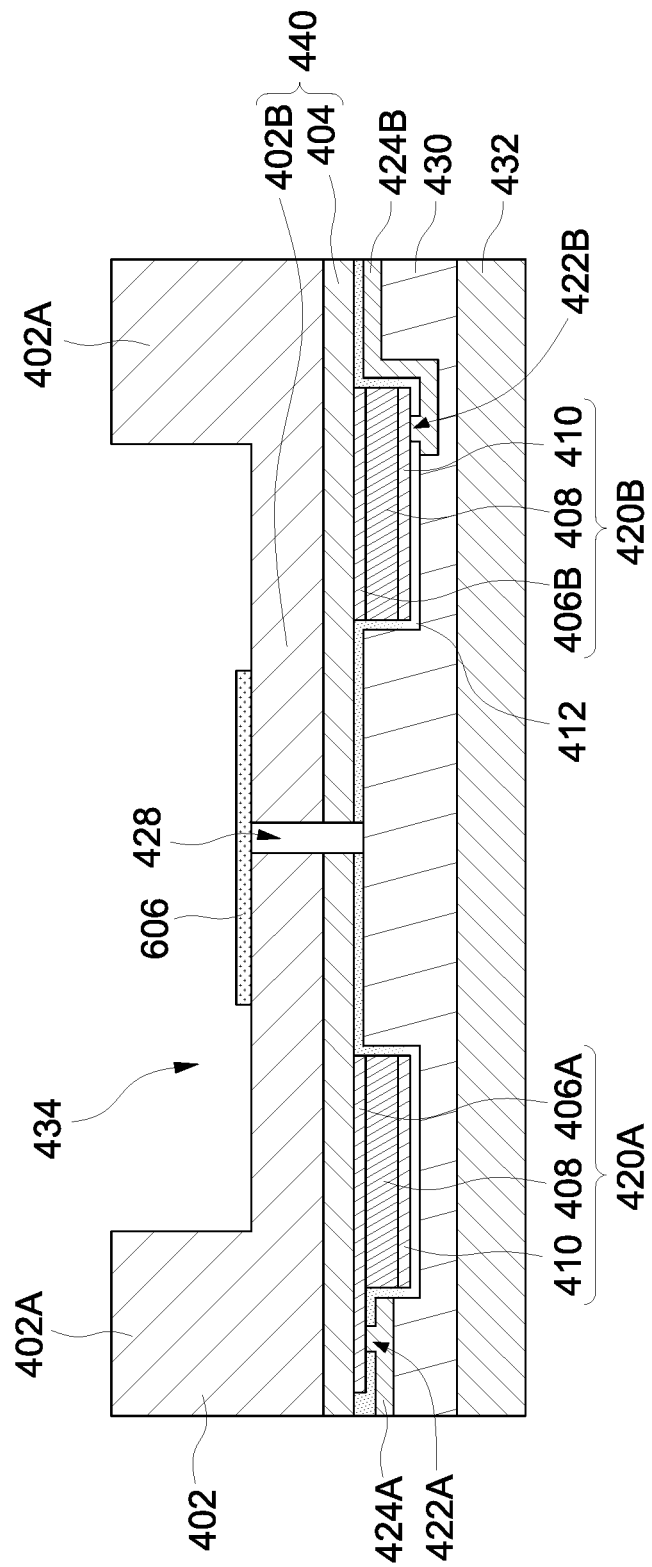
FIGS. 12 and 13 are cross-sectional views of some embodiments of a MEMS device at various fabrication stages alternative to FIGS. 9 to 11 according to aspects of the present disclosure.
Figure 13:
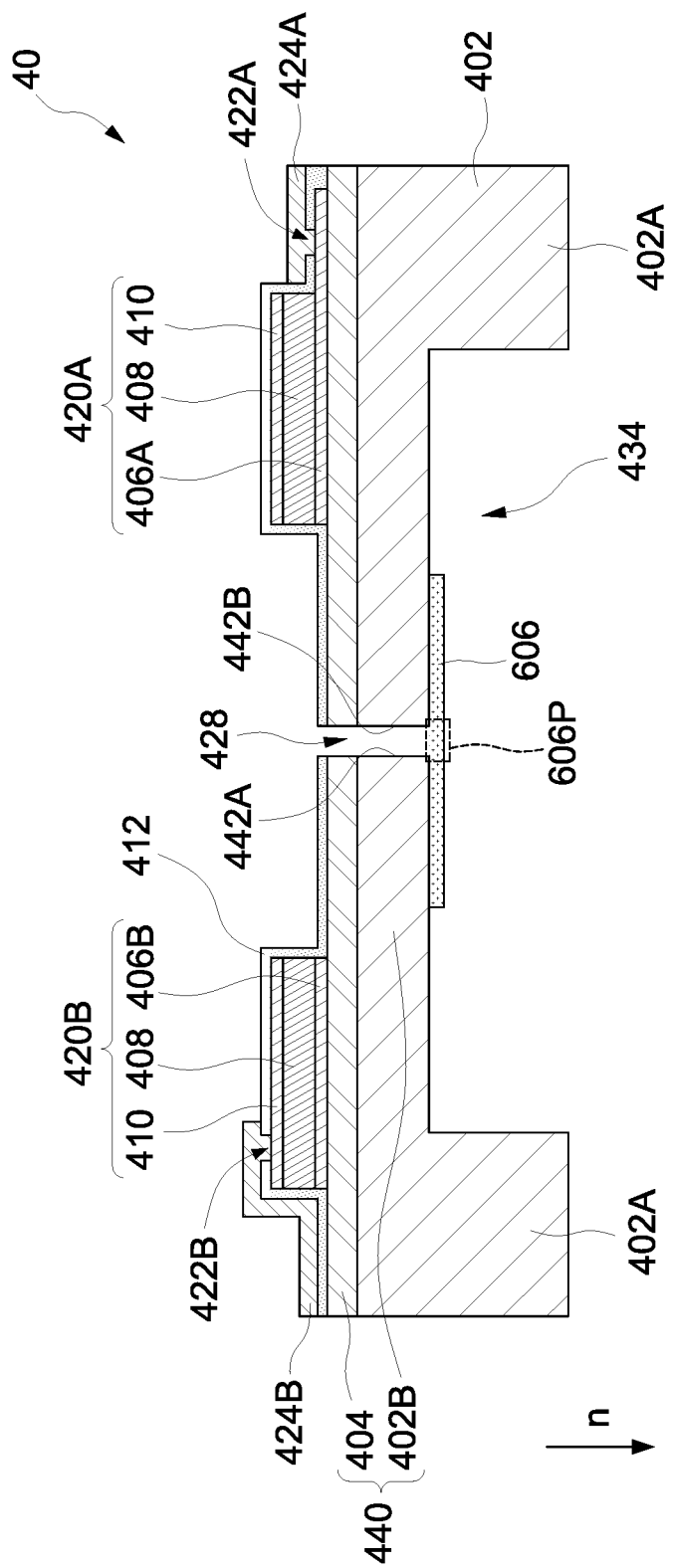

FIGS. 12 and 13 are cross-sectional views of some embodiments of a MEMS device at various fabrication stages alternative to FIGS. 9 to 11 according to aspects of the present disclosure. In some embodiments as shown in FIG. 12, following forming the cavity 434 in the substrate 402 as shown in FIG. 8, the sealing film 606 is formed on a surface of the membrane 440 adjacent to the cavity 434. In other words, the sealing film 606 is disposed between the cavity 434 and the opening 428 of the membrane 440. FIG. 12 illustrates that the sealing film 606 fully seals the opening 428 of the membrane 440 and blocks the opening 428 from the cavity 434. However, the sealing film 606 may also be disposed conformally along at least a portion of the first sidewall 442A and/or the second sidewall 442B of the opening 428 in a way similar to FIG. 11.

Referring to FIG. 13, following forming the sealing film 606 as shown in FIG. 12, the substrate 402 is flipped over such that the sealing film 606, the cavity 434 and the substrate 402 face downwards and the carrier 432 faces upwards. Subsequently, the carrier 432 and the temporary adhesive layer 430 are removed to form the MEMS device 40. The resulting MEMS device 40 includes the sealing film 606 disposed on a surface of the membrane 440 adjacent to the anchoring portion 402A of the substrate 402.

Figure 14A:
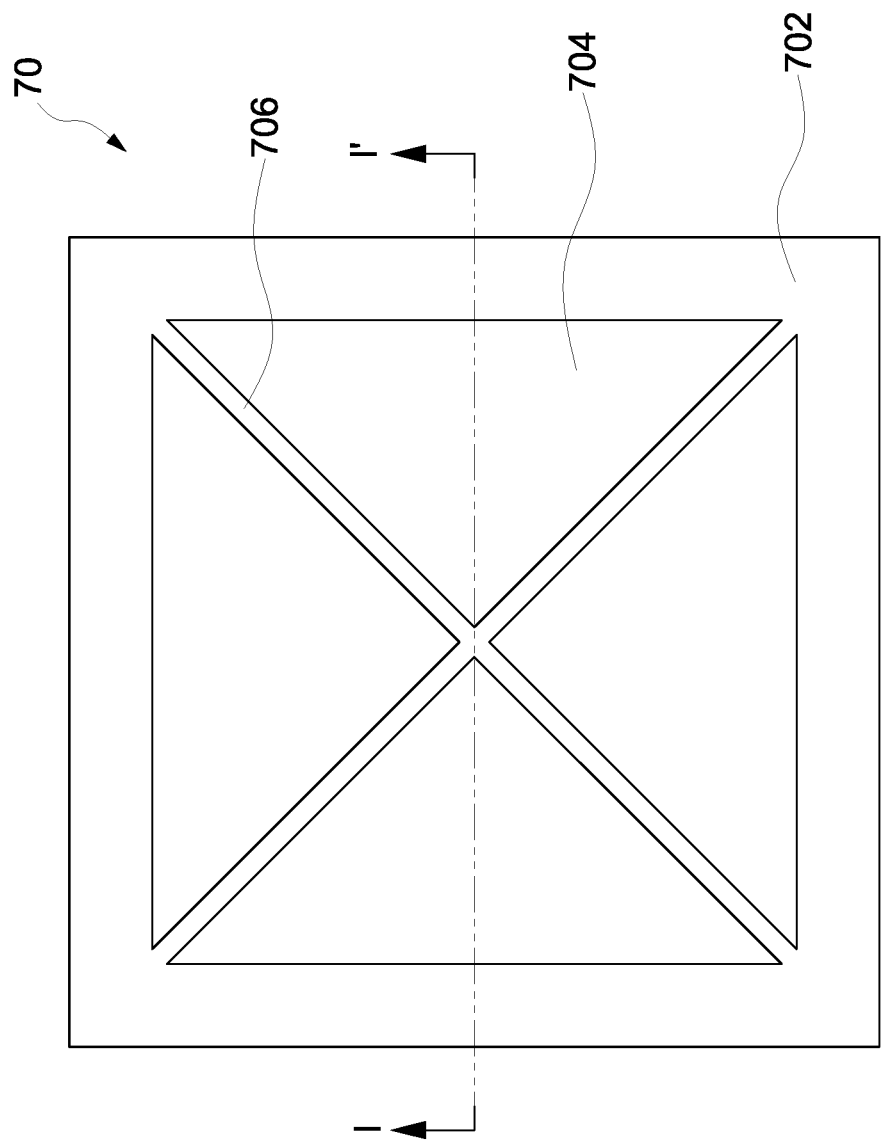
FIG. 14A is a schematic top view of some embodiments of a MEMS device before a sealing film is disposed, according to aspects of the present disclosure.
Figure 14B:
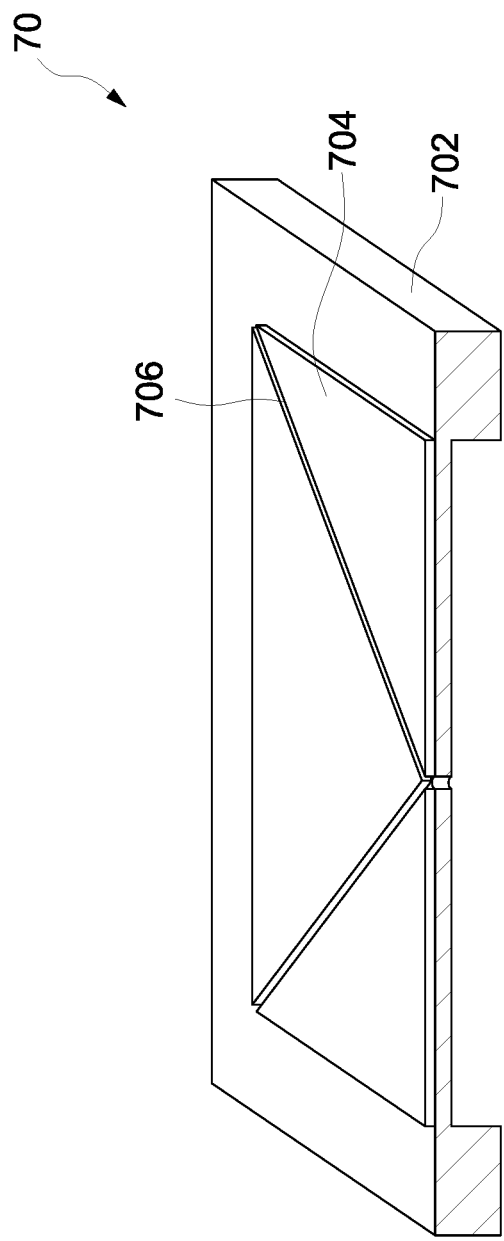
FIG. 14B is a perspective view of a cross section taken along line I-I' of FIG. 14A.

FIG. 14A is a schematic top view of some embodiments of a MEMS device before a sealing film is disposed, according to aspects of the present disclosure. FIG. 14B is a perspective view of the MEMS device cut through the line I-I' of FIG. 14A. As shown in FIGS. 14A and 14B, a MEMS device 70 includes a substrate/anchor 702 and a diaphragm 704, wherein the diaphragm 704 has an opening 706 through the diaphragm 706. In some embodiments, the substrate/ anchor 702 is the substrate 402 as stated above. In some embodiments, the diaphragm 704 is the diaphragm structure 104 as stated above. In some embodiments, the diaphragm 704 includes the membrane 404 as stated above. In some embodiments, the opening 706 is the opening 106 or the opening 428 as stated above.

Figure 14C:
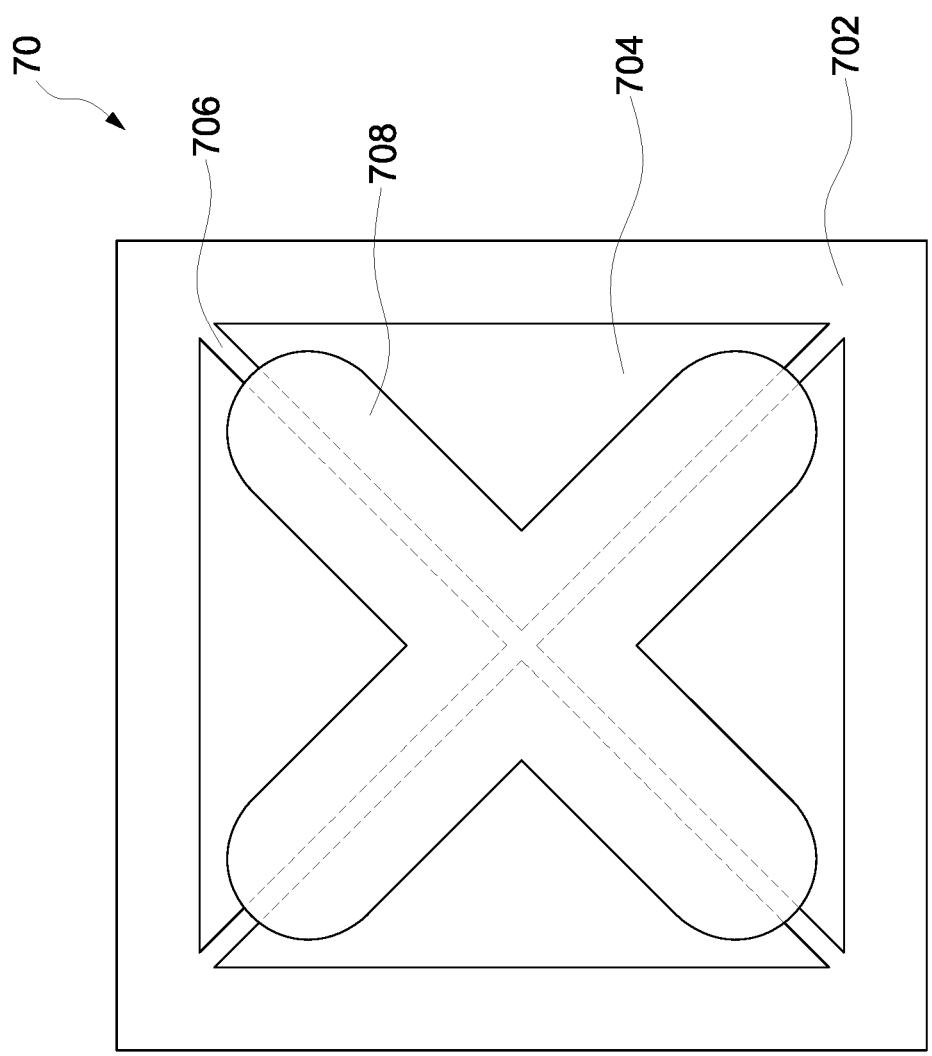
FIG. 14C is a schematic top view of some embodiments of a MEMS device after a sealing film is disposed, according to aspects of the present disclosure.

FIG. 14C is a schematic top view of some embodiments of a MEMS device after a sealing film is disposed, according to aspects of the present disclosure. As shown in FIG. 14C, the MEMS device 70 further includes a sealing film 708 to partially or fully seal the opening 706 of the diaphragm 704. In some embodiments, the sealing film 706 is the sealing film 110 or the sealing film 606 as stated above.

Figure 15A:
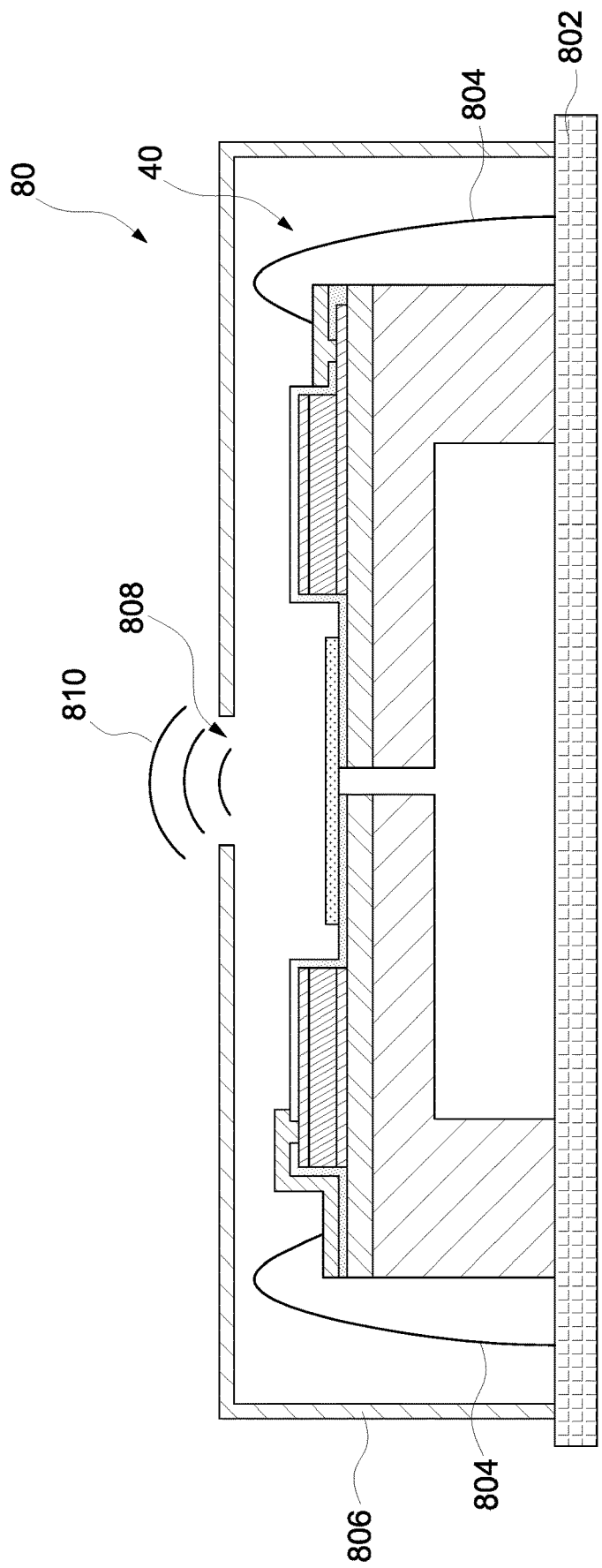
FIGS. 15A and 15B are cross-sectional views of some embodiments of a packaged MEMS device according to aspects of the present disclosure.
Figure 15B:
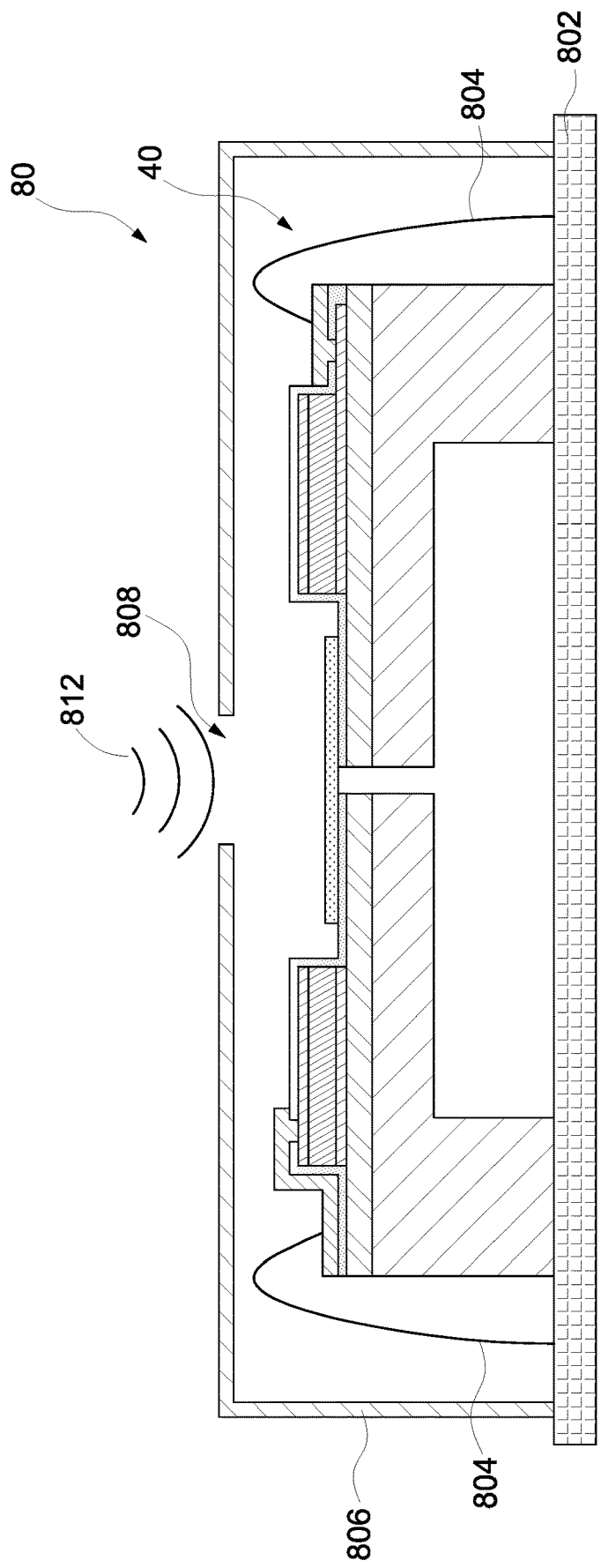

FIGS. 15A and 15B are cross-sectional views of some embodiments of a packaged MEMS device according to aspects of the present disclosure. As shown in FIGS. 15A and 15B, a packaged MEMS device 80 includes a base 802, a case 806, and the MEMS device 40. The MEMS device 40 is bonded to the base 802 through a wire 804 and enclosed in the case 806. The case 806 has an opening 808 for sound waves to pass through. In some embodiments as shown in FIG. 15A, the packaged MEMS device 80 generates a sound wave output 810 by bending a diaphragm or membrane upwards and downwards repeatedly and the sound wave output 810 transmits through the opening 808 of the case 806 to ambient environment, in which case the packaged MEMS device 80 may function as a speaker. In some embodiments as shown in FIG. 15B, a sound wave input 812 transmits from ambient environment through the opening 808 of the case 806 to the MEMS device 40. The sound wave input 812 causes the diaphragm or membrane of the MEMS device 40 to vibrate, and is transformed into an electrical signal by a piezoelectric layer of the MEMS device 40. The electric signal is then transmitted to the base 802 through the wire 804, In such case, the packaged MEMS device may function as a microphone.

The present disclosure provides a MEMS device and a method for manufacturing a MEMS device. The MEMS device includes a diaphragm or membrane having an opening therethrough. The opening decreases rigidity of the diaphragm or membrane and allows greater displacement of the diaphragm or membrane, thereby improving the performance of the MEMS device (e.g., greater SPL or higher sensitivity). Moreover, the MEMS device includes a sealing film which partially or fully seals the opening to prevent or hinder air from leaking through the opening. Accordingly, the performance of the MEMS device can be further improved. In addition, with the sealing film, the opening of the diaphragm or membrane could be made with a larger dimension during an etching operation and therefore the operation of forming the opening becomes easier and more controllable.

In some embodiments, a MEMS device is provided. The MEMS device includes an anchor, a diaphragm structure, and a sealing film. The diaphragm structure is disposed over the anchor and has an opening through the diaphragm structure. The sealing film covers at least a portion of the opening of the diaphragm structure.

In some embodiments, a MEMS device is provided. The MEMS device includes an anchor, a membrane and a sealing film. The membrane has a stationary end fixed to the anchor, and a movable end opposite to the stationary end. The movable end defines an opening through the membrane. The opening of the membrane has a first sidewall and a second sidewall opposite to the first sidewall. The sealing film is disposed over a surface of the membrane. A projection of a portion of the sealing film in a direction normal to the surface of the membrane is between the first sidewall and the second sidewall of the opening.

In some embodiments, a method for manufacturing a MEMS device is provided. The method includes the following operations. A diaphragm structure is formed over a substrate. An opening is formed through the diaphragm structure. A dimension of the opening is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MEMS device, comprising:
   an anchor;
   a diaphragm structure over the anchor, the diaphragm structure having an opening through the diaphragm structure; and
   a sealing film covering at least a portion of the opening, wherein the sealing film forms a bridge across the opening of the diaphragm structure, wherein the diaphragm structure comprises a piezoelectric layer and the sealing film comprises a dielectric layer.

2. The MEMS device of claim 1, wherein the sealing film angles towards a sidewall of the opening.

3. The MEMS device of claim 1, wherein the diaphragm structure has a lower surface adjacent to the anchor, and the sealing film is on the lower surface of the diaphragm.

4. The MEMS device of claim 1, wherein the diaphragm structure has a lower surface adjacent to the anchor and an upper surface opposite to the lower surface, and the sealing film is on the upper surface of the diaphragm structure.

5. The MEMS device of claim 1, wherein the sealing film comprises a flexible thin film.

6. The MEMS device of claim 1, wherein the diaphragm structure further comprises a lower electrode layer and an upper electrode layer sandwiching the piezoelectric layer.

7. The MEMS device of claim 1, wherein the sealing film partially overlaps the diaphragm structure, and partially exposes the diaphragm structure.

8. A MEMS device, comprising:
   an anchor;
   a membrane having a stationary end fixed on the anchor, and a movable end opposite to the stationary end and defining an opening through the membrane, the opening having a first sidewall and a second sidewall opposite to the first sidewall;
   a sealing film over a surface of the membrane; and
   a first electrode stack and a second electrode stack over the membrane, wherein the sealing film is disposed between the first electrode stack and the second electrode stack,
   wherein a projection of a portion of the sealing film in a direction normal to the surface of the membrane is between the first sidewall and the second sidewall of the opening, and the sealing film fully seals the opening of the membrane.

9. The MEMS device of claim 8, further comprising a passivation layer along an upper surface of the membrane, wherein the sealing film is disposed on the passivation layer.

10. The MEMS device of claim 8, wherein the sealing film is disposed on the surface of the membrane adjacent to the anchor.

11. The MEMS device of claim 8, wherein the sealing film partially covers the membrane and partially exposes the membrane.

12. A method for manufacturing a MEMS device, comprising:
   forming a first electrode stack and a second electrode stack over a substrate;
   forming a diaphragm structure over the substrate;
   forming an opening between the first electrode stack and the second electrode stack and through the diaphragm structure;
   reducing a dimension of the opening; and
   forming a sealing film to fully seal the opening.

13. The method of claim 12, further comprising forming a temporary adhesive layer and a carrier over the diaphragm structure, forming a cavity in the substrate, and removing the temporary adhesive layer and the carrier after forming the cavity in the substrate.

14. The MEMS device of claim 8, wherein each of first electrode stack and the second electrode stack comprises a lower electrode layer, an upper electrode layer and a piezoelectric layer sandwiched between the lower electrode layer and the upper electrode layer.

15. The MEMS device of claim 8, wherein the sealing film comprises a dielectric layer.

16. The MEMS device of claim 8, wherein the sealing film comprise a flexible thin film.

17. The method of claim 13, wherein the opening is connected to the cavity.

18. The method of claim 13, wherein the opening is separated from the cavity by the sealing film.

19. The method of claim 12, wherein each of the first electrode stack and the second electrode stack comprises a lower electrode layer, an upper electrode layer, and a piezoelectric layer between the lower electrode layer and the upper electrode layer.

20. The method of claim 19, wherein the lower electrode layers of the first electrode stack and the second electrode stacked are separated from the substrate by a dielectric layer.

\* \* \* \* \*